United States Patent
Tark et al.

(10) Patent No.: US 11,251,322 B2
(45) Date of Patent: Feb. 15, 2022

(54) PHOTOVOLTAIC POWER GENERATION MODULE

(71) Applicants: POSCO, Pohang-si (KR); RESEARCH INSTITUTE OF INDUSTRIAL SCIENCE & TECHNOLOGY, Pohang-si (KR)

(72) Inventors: Sung-Ju Tark, Pohang-si (KR); Tae-Won Kim, Pohang-si (KR); A-Rong Kim, Pohang-si (KR); Kun-Hoon Baek, Seoul (KR); Jun-Hong Kim, Seoul (KR)

(73) Assignees: POSCO, Pohang-si (KR); RESEARCH INSTITUTE OF INDUSTRIAL SCIENCE & TECHNOLOGY, Pohang-si (KR)

( * ) Notice: Subject to any disclaimer, the term of this patent is extended or adjusted under 35 U.S.C. 154(b) by 0 days.

(21) Appl. No.: 16/964,350

(22) PCT Filed: Dec. 7, 2018

(86) PCT No.: PCT/KR2018/015517
§ 371 (c)(1),
(2) Date: Jul. 23, 2020

(87) PCT Pub. No.: WO2019/132307
PCT Pub. Date: Jul. 4, 2019

(65) Prior Publication Data
US 2021/0036172 A1    Feb. 4, 2021

(30) Foreign Application Priority Data
Dec. 26, 2017    (KR) .................. 10-2017-0180272

(51) Int. Cl.
*H01L 31/048*    (2014.01)
*H01L 31/054*    (2014.01)
(Continued)

(52) U.S. Cl.
CPC ........ *H01L 31/048* (2013.01); *H01L 31/0547* (2014.12); *H02S 20/22* (2014.12); *H02S 40/22* (2014.12)

(58) Field of Classification Search
CPC ............. H01L 31/0543; H01L 31/0547; H01L 31/048; H01L 31/0488; H01L 31/054;
(Continued)

(56) References Cited

U.S. PATENT DOCUMENTS

| | | | |
|---|---|---|---|
| 4,379,202 A * | 4/1983 | Chalmers ............ | H01L 31/0547 136/256 |
| 2009/0194156 A1 * | 8/2009 | Grommesh ......... | H01L 31/0488 136/256 |

(Continued)

FOREIGN PATENT DOCUMENTS

| | | |
|---|---|---|
| JP | 2001-230437 A | 8/2001 |
| JP | 2013-149803 A | 8/2013 |

(Continued)

OTHER PUBLICATIONS

JP-2015153836-A English machine translation (Year: 2015).*

(Continued)

*Primary Examiner* — Andrew J Golden
(74) *Attorney, Agent, or Firm* — Morgan, Lewis & Bockius LLP (57) ABSTRACT

Disclosed is a photovoltaic power generation module having a single layer structure in which a pattern glass and a solar cell module are integrated. The disclosed photovoltaic power generation module comprises: a pattern glass comprising a base member, and a pattern member provided thereon in which an optical pattern is formed; a solar cell module provided with a solar cell; a plurality of supportive adhering parts in a pillar shape adhered to the pattern member; and a filler filled between the supportive adhering
(Continued)

part and the solar cell module, wherein the pattern glass and the solar cell module are integrated through the supportive adhering parts and the filler, and the height of the supportive adhering parts are configured to be greater than the height of the pattern member so that a gap for forming an air layer between the pattern member and the filler can be provided.

11 Claims, 9 Drawing Sheets

(51) Int. Cl.
*H02S 40/22* (2014.01)
*H02S 20/22* (2014.01)

(58) Field of Classification Search
CPC ....... H01L 31/055; H02S 40/22; H02S 40/20; H02S 20/22; H02S 20/23
USPC .......................................................... 136/251
See application file for complete search history.

(56) References Cited

U.S. PATENT DOCUMENTS

| | | | |
|---|---|---|---|
| 2011/0222145 A1 | 9/2011 | Ito | |
| 2012/0042944 A1* | 2/2012 | Yen | H02S 40/22 136/256 |
| 2012/0247541 A1* | 10/2012 | Wootton | H01L 31/055 136/251 |
| 2012/0260970 A1* | 10/2012 | Wirth | H01L 31/0543 136/248 |
| 2016/0276501 A1* | 9/2016 | Wassvik | H02S 40/22 |
| 2017/0133534 A1 | 5/2017 | Ko et al. | |
| 2018/0145626 A1 | 5/2018 | Kim et al. | |
| 2020/0161491 A1 | 5/2020 | Kim et al. | |

FOREIGN PATENT DOCUMENTS

| | | | |
|---|---|---|---|
| JP | 2015153836 A | * | 8/2015 |
| JP | 2017-046412 A | | 3/2017 |
| KR | 10-2010-0089326 A | | 8/2010 |
| KR | 10-2011-0103858 A | | 9/2011 |
| KR | 10-2012-0035294 A | | 4/2012 |
| KR | 10-2013-0109929 A | | 11/2012 |
| KR | 10-2013-0030390 A | | 3/2013 |
| KR | 10-1307015 B1 | | 9/2013 |
| KR | 10-1497941 B1 | | 3/2015 |
| KR | 10-1682133 B1 | | 12/2016 |
| KR | 10-1791130 B1 | | 10/2017 |
| KR | 10-1917533 B1 | | 11/2018 |
| KR | 10-1940921 B1 | | 1/2019 |

OTHER PUBLICATIONS

JP-2017046412-A English machine translation (Year: 2017).*
Extended European Search Report dated Jan. 29, 2021 issued in European Patent Application No. 18894967.1.
International Search Report dated Mar. 8, 2019 issued in International Patent Application No. PCT/KR2018/015517.

* cited by examiner

PHOTOVOLTAIC POWER GENERATION MODULE

CROSS-REFERENCE OF RELATED APPLICATIONS

This application is the U.S. National Phase under 35 U.S.C. § 371 of International Patent Application No. PCT/KR2018/015517, filed on Dec. 7, 2018, which in turn claims the benefit of Korean Application No. 10-2017-0180272, filed on Dec. 26, 2017, the entire disclosures of which applications are incorporated by reference herein.

TECHNICAL FIELD

The present disclosure relates to a photovoltaic power generation module having a single layer structure, and more particularly, a photovoltaic power generation module having a single layer structure in which a pattern glass and a solar cell module are integrated.

BACKGROUND ART

When a transparent protective glass is used when a solar cell module having a solar cell (solar cell) is applied to an exterior wall of a building, incident efficiency of sunlight applied from above the exterior wall may be maximized, but there may be an aesthetic problem for an observer who observes the building from below an exterior wall.

As a solution to this, a method of applying color to transparent protective glass may be considered. In this case, however, concealment by color may increase such that the aesthetic problem may be addressed, but incident efficiency of sunlight (transmittance of the protective glass) may degrade, which may be another problem.

Meanwhile, to increase concealment for an observer while preventing a decrease in transmittance for sunlight, by attaching a film of a light-shielding barrier rib structure to the transparent protective glass, transmittance in a forward direction may be secured and concealment in a side direction may also increase at the same time such that the aesthetic problem may be resolved.

However, the above-described method may have an inevitable limitation in which degradation of transmittance of sunlight with respect to an incident angle in a side surface direction, not an incident angle in a front surface direction may not be avoidable. In other words, the above-described method has a limitation in that, by transmitting a portion of sunlight entering without changing a path of the sunlight and reflecting (shielding) the other portion, the same transmittance may be applied without distinguishing a region from which sunlight does not need to be reflected from a region from which sunlight needs to be reflected. Accordingly, as for the above-described method, in the region in which sunlight needs to be collected, transmittance may be degraded as an unnecessary increase of reflectance (shielding rate), and transmittance of gaze light transmitted to an observer may unnecessarily increase such that reflectance (shielding rate) may be degraded, which may be a limitation.

Accordingly, research into a photovoltaic power generation module including a pattern glass, which may address the above-described problem, has been necessary.

A photovoltaic power generation module in the prior art has a multilayer structure in which a solar cell module and a transparent protective glass are separately installed.

Figure 1:
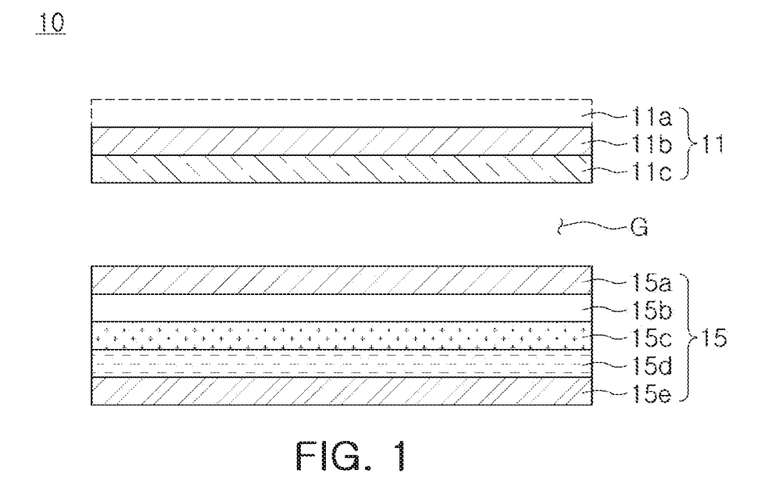
FIG. 1 is a schematic view illustrating a photovoltaic power generation module having a multilayer structure of the prior art.

Referring to FIG. 1, a photovoltaic power generation module 10 having a multilayer structure of the prior art may have a solar cell module 15 installed on a building side and a transparent protective glass unit 11 installed on an exterior side of the building, and an air layer G may be formed between the solar cell module 15 and the protective glass unit 11.

In this case, the protective glass unit 11 may include a color layer 11c on an incident light exit side of protective glass 11b, and an anti-reflection (AR) coating layer 11a may be provided on an incident light input side of the protective glass 11b.

Also, as one example, the solar cell module 15 may include a glass 15a, a sealing material 15b, a solar cell 15c, a sealing material 15d, and a back sheet 15e as illustrated in FIG. 1.

Here, the glass 15a may protect the solar cell module 15 from physical damage and may increase transmittance of light such that sunlight may be transmitted to the solar cell 15c. The sealing materials 15b and 15d may protect the fragile solar cell 15c and a circuit from impact and may allow sunlight to pass therethrough, and may be mainly formed of ethylene-vinyl acetate (EVA). Also, the back sheet 15e may be disposed on a rear surface of the solar cell 15c to protect the solar cell 15c from external environments such as heat, humidity, and ultraviolet rays, and may also further improve efficiency of the solar cell module 15 through re-reflection of incoming sunlight.

As described above, the photovoltaic power generation module 10 having a multilayer structure of the prior art may have a lot of difficulties in construction because the solar cell module 15 and the transparent protective glass 11 are provided as separate members.

Accordingly, a technique for configuring the photovoltaic power generation module 10 having a multilayer structure to have a single layer structure has also been required.

PRIOR ART DOCUMENT (Reference 1) Korean Patent Application No. 10-2013-0029428

DISCLOSURE

Technical Problem

The present disclosure has been devised to solve at least some of the problems of the prior art described above, and may have a purpose of providing a photovoltaic power generation module which may reduce degradation of optical efficiency (securing transmittance at a positive viewing angle and securing reflectance at a negative viewing angle) of an optical pattern and may be configured to have a single layer structure.

Also, the present disclosure has a purpose of providing a photovoltaic power generation module which may decrease a reduction in a refractive effect generated between an optical pattern and an air layer.

In addition, as one aspect, the present disclosure has a purpose of providing a photovoltaic power generation module which may maintain reflectance at a viewing angle of a lower side (ground) of a building to be an appropriate level or higher during a process for configuring the photovoltaic power generation module to have a single layer structure.

Technical Solution

As one aspect for achieving the above purposes, the present disclosure provides a photovoltaic power generation module including a pattern glass including a base member, and a pattern member provided on the base member and including an optical pattern formed thereon; a solar cell module including a solar cell; a plurality of supportive adhering parts adhered to the pattern member and each having a cylindrical shape; and a filler filling a space between the supportive adhering part and the solar cell module, wherein the pattern glass and the solar cell module are integrated with each other through the supportive adhering part and the filler, and wherein a height of the supportive adhering part is formed to be higher than a height of the pattern member such that a gap for forming an air layer between the pattern member and the filler is provided.

The optical pattern may include an asymmetrical prism.

The optical pattern may have a shape in which transmittance is higher and reflectance is lower at a viewing angle on one side than at a viewing angle on the other side with reference to a surface perpendicular to the base member.

The gap may be configured to be within a range of 10-1000 μm.

The filler may include an acetate-based or silicone-based material.

The supportive adhering part may include an optically clear adhesive (OCA).

Viewing on a planar surface, an overall area of the supportive adhering part may be 3-20% of an area of the pattern member, and an overall area of the supportive adhering part may be 5-13% of an area of the pattern member.

The supportive adhering part may include a light scattering agent. In this case, the light scattering agent may be included in the supportive adhering part by 5-60 weight %.

The supportive adhering part may include a color pigment, and the color pigment may be included in the supportive adhering part by 3-30 weight %.

The photovoltaic power generation module may include a glass for protecting the solar cell, and the filler may fill a space between the glass and the supportive adhering part.

Advantageous Effects

According to one embodiment of the present disclosure having the above configuration, an effect in which degradation of optical efficiency (securing transmittance at a positive viewing angle and securing reflectance at a negative viewing angle) of an optical pattern may be reduced, and a single layer structure may be available may be obtained.

Also, according to one embodiment of the present disclosure, reduction of a refraction effect generated between an optical pattern and an air layer may be decreased.

Also, according to one embodiment of the present disclosure, an effect in which reflectance at a viewing angle of a lower side (ground) of a building may be maintained to be an appropriate level or higher during a process for providing a single layer structure may be obtained.

DESCRIPTION OF DRAWINGS

FIGS. 6A, 6B and 6C are a view illustrating structures of a pattern member and a supportive adhering part illustrated in FIG. 4, FIGS. 6A and 6B are schematic views illustrating an example in which a gap between supportive adhering parts is varied.

FIGS. 8A and 8B are a graph showing comparison of transmittance and reflectance between an embodiment of the present disclosure and a first comparative example according to an area ratio of a supportive adhering part, and FIG. 8A shows transmittance, and FIG. 8B shows reflectance;

FIGS. 10A and 10B are a graph showing comparison of transmittance and reflectance between a modified example of the present disclosure illustrated in FIG. 9 and a first comparative example, and FIG. 10A shows transmittance, and FIG. 10B shows reflectance;

FIGS. 11A and 11B is a graph showing comparison of transmittance and reflectance between another modified example of the present disclosure and a first comparative example, and FIG. 11A shows transmittance, and FIG. 11B shows reflectance.

BEST MODE FOR INVENTION

Hereinafter, preferred embodiments of the present disclosure will be described with reference to the accompanying drawings. However, embodiments of the present disclosure may be modified in various other forms, and the scope of the present disclosure is not limited to the embodiments described below. In addition, embodiments of the present disclosure are provided to fully describe the present disclosure to those skilled in the art. The shape and size of elements in the drawings may be exaggerated for clarity of description. In particular, in the schematic view of a cross section, a thickness of each layer is expressed as the same for ease of illustration, but a thickness of each layer may be formed differently.

Also, in this specification, a singular term includes a plural form unless otherwise indicated, and throughout the specification, the same reference numerals refer to the same components or corresponding components.

Hereinafter, embodiments of the present disclosure will be described with reference to the drawings.

Figure 4:
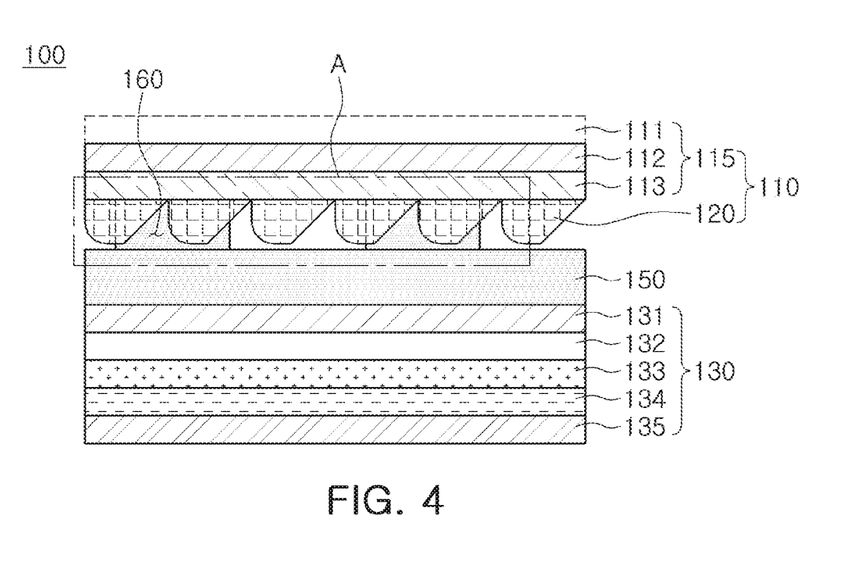
FIG. 4 is a schematic view illustrating a photovoltaic power generation module having a single layer structure of an embodiment of the present disclosure.
Figure 5:
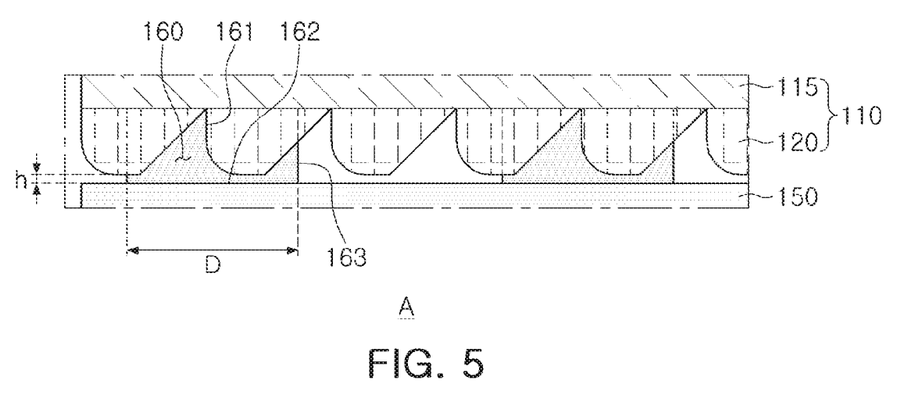
FIG. 5 is an enlarged view illustrating portion "A" in FIG. 4.

Referring to FIGS. 4 and 5, a photovoltaic power generation module 100 according to an embodiment of the present disclosure may include a pattern glass 110 including a pattern member 120 having an optical pattern formed thereon, a solar cell module 130 having a solar cell 133, a plurality of supportive adhering parts 160 adhered to the pattern member 120 and each having a cylindrical shape, and a filler 150 filling a space between the supportive adhering part 160 and the solar cell module 130.

As illustrated in the examples in FIGS. 4 and 5, the pattern glass 110 may include a base member 115, and a pattern member 120 provided in the base member 115 and having an optical pattern formed thereon.

In the base member 115, a color layer 113 may be formed on an incident light exit side of a protective glass 112, and an AR coating layer 111 may be provided on an incident light input side of the protective glass 112. However, a structure of the base member 115 is not limited thereto, and the color layer 113 or the AR coating layer 111 may not be provided, or another layer may be additionally formed.

Also, the pattern member 120 may be provided in the base member 115, and an optical pattern may be formed on the pattern member 120.

In this case, the pattern member 120 may have a shape including an asymmetrical prism as in the example illustrated in FIGS. 4 and 5, but a shape of the asymmetrical prism is not limited thereto.

Figure 12A:
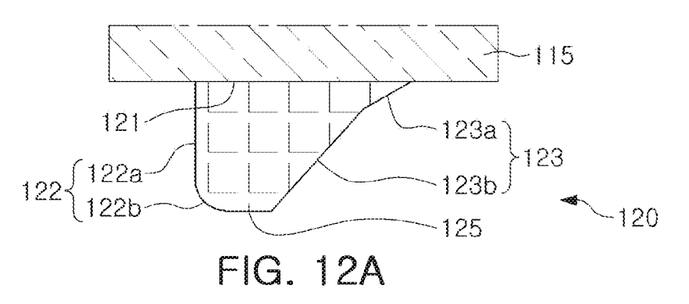
FIGS. 12A, 12B and 12C are schematic views illustrating a modified example of an optical pattern provided in a pattern glass of the present disclosure.
Figure 12B:
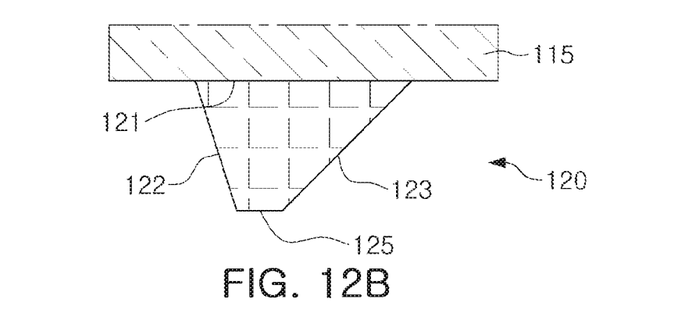
Figure 12C:
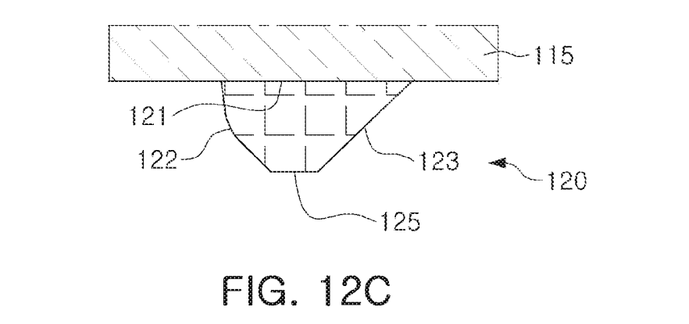

For example, as illustrated in FIG. 12A, the pattern member 120 having an asymmetrical prism shape may have a shape in which a base portion 121 and a planar portion 124 are included, a short-surface portion 122 may be formed by a linear portion 122a and a curved portion 122b, and a long-surface portion 123 may be formed by two linear portions 123a and 123b, or as illustrated in FIG. 12B, the pattern member 120 may have a shape in which both the short-surface portion 122 and the long-surface portion 123 may be formed by linear lines, or as illustrated in FIG. 12C, the pattern member 120 may have a shape in which the short-surface portion 122 may be formed by a curved line and the long-surface portion 123 may be formed by a linear line, such that the pattern member 120 may have various shapes. Also, FIGS. 5 and 12 illustrate an asymmetrical prism having a planar portion 125, but the pattern member 120 in the embodiment of the present disclosure may include an asymmetrical prism which does not have a planar portion.

Also, the optical pattern formed on the pattern member 120 may have a shape in which transmittance may be higher and reflectance may be lower at a viewing angle on one side than at a viewing angle on the other side with reference to a surface perpendicular to the base member 115. Here, the configuration in which transmittance or reflectance may be high or low may be determined by comparing a maximum value or a minimum value of transmittance/reflectance at a viewing angle on one side and at a viewing angle on the other side.

In other words, the optical pattern illustrated in FIGS. 4 and 5 may have a shape in which, with reference (a reference surface) to a surface perpendicular to the base member 115, when light is incident in a direction inclined to the left side from the reference surface, transmittance may be higher and reflectance may be lower than when light is incident in a direction inclined to the right side from the reference surface (the configuration will be described later with reference to FIGS. 8A and 8B).

Accordingly, when the pattern member 120 illustrated in FIGS. 4 and 5 is stood for the left side to be an upper side (when the pattern member 120 is rotated in a clockwise direction by 90 degrees), transmittance of light incident from the left side (an upper side) may increase such that the amount of light transmitted to the solar cell 133 may increase, and as transmittance of light incident from the right side (a lower side) is relatively low and reflectance thereof is relatively high, an unnecessary increase of transmittance of gaze light transmitted to an observer located on the right side (a lower side) may be prevented (the configuration is disclosed in the patent application No. 2017-0105067 filed by the present inventor on Aug. 17, 2017, and the disclosure of the above application is included in this specification as a reference).

Also, as for various modified examples of the pattern member 120 illustrated in FIGS. 12A, 12B and 12C, the pattern member 120 may have a shape in which, with reference to a surface perpendicular to the base member 115, when light is incident in a direction inclined to the left side, transmittance may be higher and reflectance may be lower than when light is incident in a direction inclined to the right side.

Also, the solar cell module 130 may include a solar cell 133.

The solar cell module 130 may include a glass 131, a sealing material 132, a solar cell 133, a sealing material 134, and a back sheet 135 as in the example illustrated in FIG. 4, but when the solar cell module 130 includes the solar cell 133, a specific structure thereof may not be limited to the example illustrated in FIG. 4. For example, a portion of the elements, such as the glass 131, or the glass 131 and sealing material 132, may not be included, or an additional layer may be added.

Here, the glass 131 may protect the solar cell module 130 from physical damage and may increase transmittance of light such that sunlight may be transmitted to the solar cell 133. The sealing materials 132 and 134 may protect the fragile solar cell 133 and the circuit from impact, and may be configured to transmit sunlight, and may be mainly formed of ethylene vinyl acetate (EVA). Also, the back sheet 135 may be disposed on a rear surface of the solar cell 133 to protect the solar cell 133 from external environments such as heat, humidity, and ultraviolet rays, and may further improve efficiency of the solar cell module 130 through re-reflection of incoming sunlight.

Also, the supportive adhering part 160 may be adhered to the pattern member 120 and may be configured to have a cylindrical shape. Also, the supportive adhering part 160 may allow the pattern glass 110 and the solar cell module 130 to be integrated with each other along with the filler 150 which will be described later.

In this case, the supportive adhering part 160 may include an optically clear adhesive (OCA). An OCA may be an optical-use transparent adhesive, and may have high transmissibility and may increase a thickness (a height) such that an OCA may function as an adhesive and a support.

An OCA may have a refractive index of about 1.5-1.6, and may be attached to a cured pattern member 120 in certain pattern.

Figure 7A:
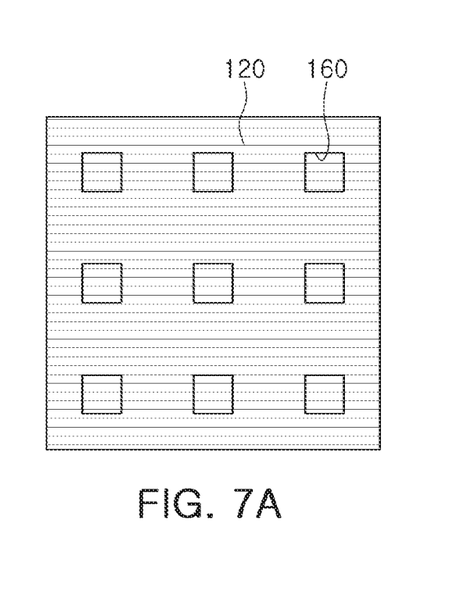
FIGS. 7A and 7B are schematic views illustrating modified examples of a shape of a supportive adhering part.
Figure 7B:
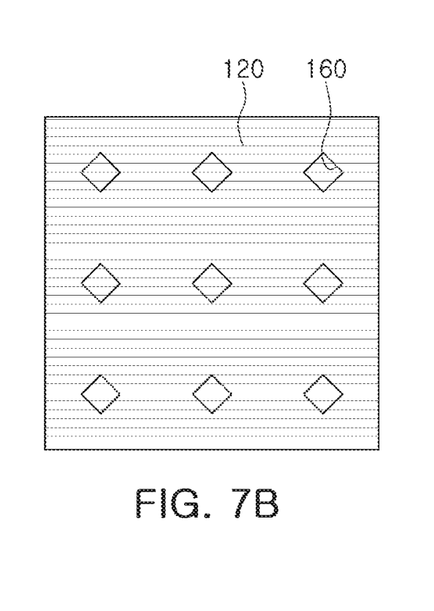

In FIGS. 4 and 5, a shape of the supportive adhering part 160 is illustrated as a cylinder having a circular cross-sectional surface, but a shape of the supportive adhering part 160 is not limited thereto. For example, the supportive adhering part 160 may have a rectangular cross-sectional surface as illustrated in FIG. 7A, and may have a rhombus-shaped cross-sectional surface as illustrated in FIG. 7B.

Also, the filler 150 may fill a space between the supportive adhering part 160 and the solar cell module 130, and may be used with the supportive adhering part 160 such that the pattern glass 110 and the solar cell module 130 may be integrated.

In this case, as illustrated in FIG. 4, when the glass 131 is provided in the solar cell module 130, the filler 150 may fill a space between the glass 131 and the supportive adhering part 160.

The filler 150 may include an acetate-based or silicon-based materials. For example, the acetate-based material may include ethylene-vinyl acetate (EVA). Also, a refractive index of the filler 150 may be approximately 1.5-1.6.

In this case, one side of the filler 150 may be coupled to the supportive adhering part 160, and the other side may be coupled to the solar cell module 130. In other words, the filling material 150 may be used with the supportive adhering part 160 to combine the pattern glass 110 and the solar cell module 130 such that the photovoltaic power generation module 100 having a single layer structure may be manufactured.

Meanwhile, the solar cell module 130 may not include the glass 131, or the glass 131 and the sealing material 132, and in this case, one side of the filler 150 may be coupled to the supportive adhering part 160, and the other side may be coupled to the sealing material 132 of the solar cell module 130 or the solar cell 133.

Also, as illustrated in FIG. 5, a height of the supportive adhering part 160 may be configured to be greater than a height of the pattern member 120 such that a gap h for forming an air layer between the filler 150 and the pattern member 120 may be formed.

Accordingly, in the photovoltaic power generation module 100 in the embodiment of the present disclosure, as there is a difference in refractive indexes between the pattern member 120 and an air layer, optical performance of the pattern member 120 may be maintained similarly to that of the photovoltaic power generation module 20 having a multilayer structure illustrated in FIG. 2, which will be described later.

In this case, the gap h for forming an air layer between the filler 150 and the pattern member 120 may be configured to be within a range of 10-1000 μm preferably.

The gap h for an air layer may have an extremely small size, but when the gap h is less than 10 μm, the pattern member 120 and the filler 150 may be partially in contact with each other due to tolerance in a manufacturing process. Thus, the gap h may be 10 μm or greater preferably. Also, when the gap h exceeds 1000 μm, a height (a thickness) of the supportive adhering part 160 may excessively increase such that a sufficient weight may not be supported. Thus, the gap h may be 1000 μm (1 mm) or less preferably.

Meanwhile, the supportive adhering part 160 may be attached to the cured pattern member 120 in certain pattern. In other words, an adhesive such as an OCA may be formed as a pattern and a cylindrical shape may be formed on the pattern member 120, and the adhesive may be UV (infrared) cured. Thereafter, the fully-cured or semi-cured supportive adhering part 160 may be attached to the filler 150.

Through this, as illustrated in FIG. 5, a portion 161 of the supportive adhering part 160 may be adhered to the pattern member 120, the other portion 162 may be attached to the filler 150, and a portion 163 of a side surface of the supportive adhering part 160 may be in contact with an air layer.

In this case, as refractive indexes of the supportive adhering part 160, the filler 150, and the pattern member 120 may be about 1.5-1.6, there may be no significant difference among the refractive indexes. Accordingly, total reflection may rarely occur in a region in which the supportive adhering part 160 is adhered to the pattern member 120 such that transmissivity may increase and reflectance may decrease.

Accordingly, when an area of the supportive adhering part 160 increases, an area in contact with the pattern member 120 may also increase such that optical performance of the pattern member 120 may degrade.

Figure 6A:
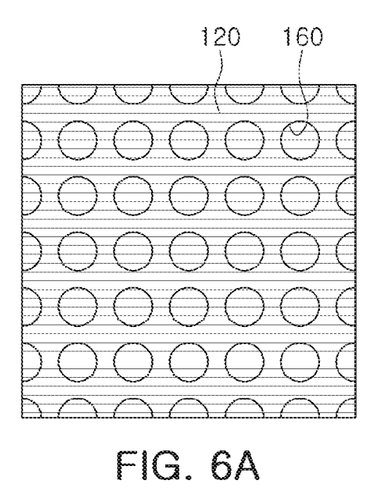
Figure 6B:
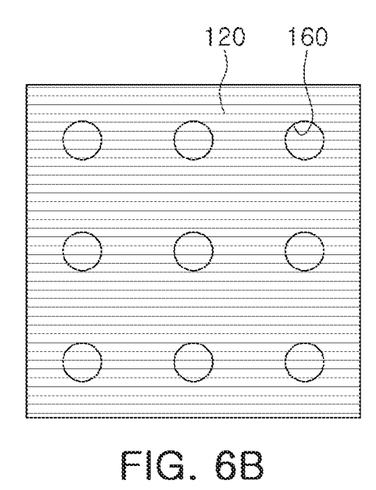

Thus, as illustrated in FIG. 6A, when the supportive adhering part 160 is installed on a wide area, transmittance may increase and reflectance may decrease as illustrated in FIG. 6B as compared to the case in which the supportive adhering part 160 is installed in a narrow area, which may cause an aesthetic problem for an observer at a viewing angle from a lower side.

Figure 6C:
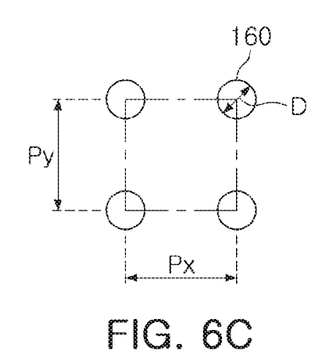
FIG. 6C is a schematic view illustrating an area range of a supportive adhering part.

Referring to FIG. 6C, an area ratio (a projected area ratio when being viewed directly on a planar surface) of the supportive adhering part 160 to the pattern member 120 on a planar surface may be calculated as below:

$$\text{Area Ratio of Supportive Adhering Part} = \pi D^2 / (4 P_x P_y) \quad \text{[Equation 1]}$$

In the equation, D: a diameter of the supportive adhering part, Px: a spacing distance of the supportive adhering part in a horizontal direction, and Py: a spacing distance of the supportive adhering part in a vertical direction.

Figure 2:
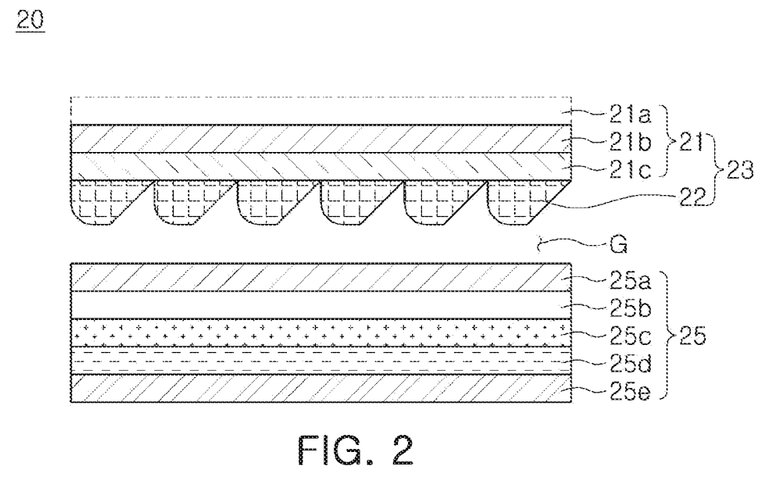
FIG. 2 is a schematic view illustrating a photovoltaic power generation module having a multilayer structure of a first comparative example.
Figure 8A:
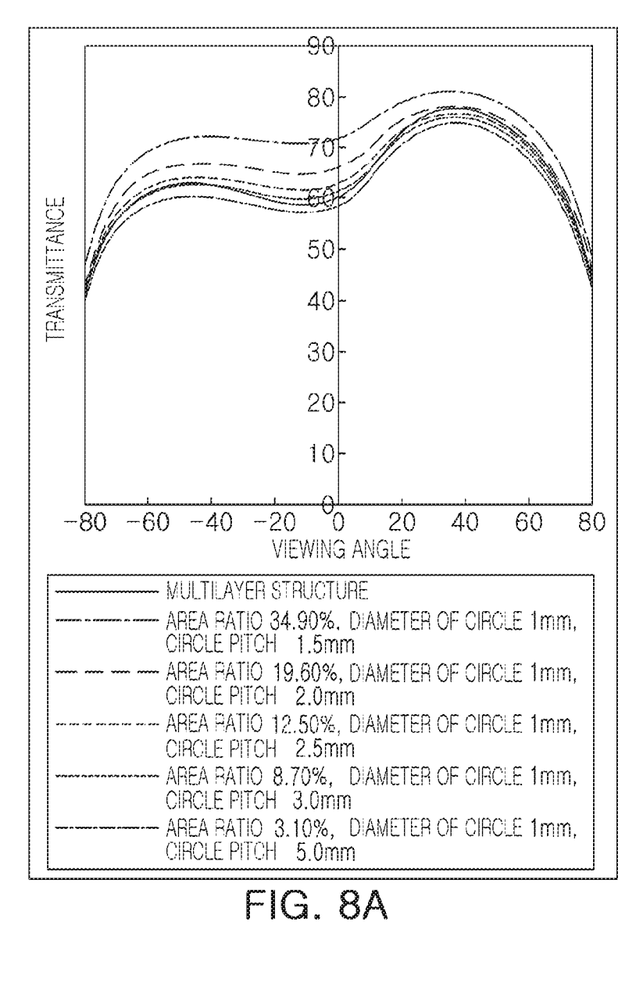
Figure 8B:
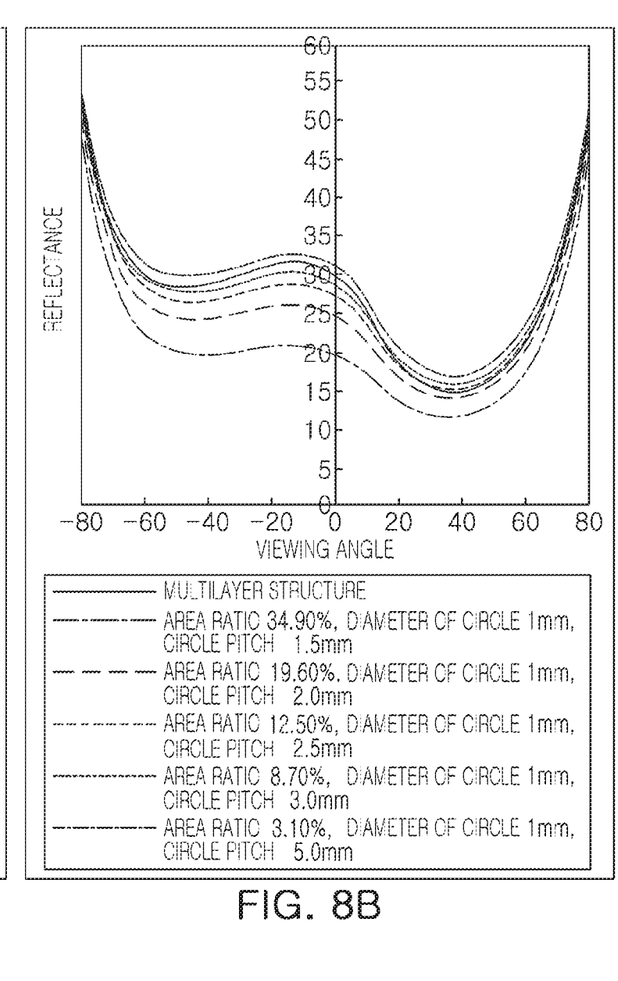

FIGS. 8A and 8B are a graph showing comparison of transmittance and reflectance with a first comparative example having a multilayer structure illustrated in FIG. 2 while changing an area ratio of the supportive adhering part 160 to the photovoltaic power generation module 100 having a single layer structure of an embodiment of the present disclosure illustrated in FIG. 4.

Figure 3:
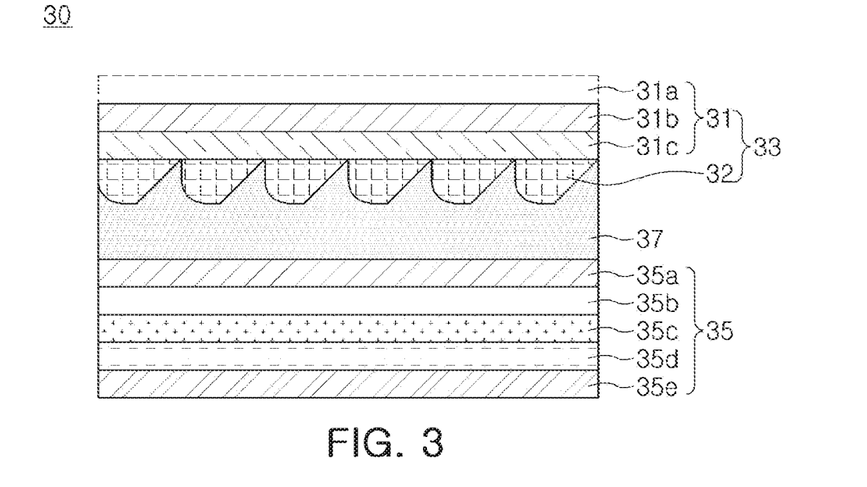
FIG. 3 is a schematic view illustrating a photovoltaic power generation module having a single layer structure of a second comparative example.

A photovoltaic power generation module 20 of a first comparative example illustrated in FIG. 2 and a photovoltaic power generation module 30 of a second comparative example illustrated in FIG. 3 were configured to have substantially the same configuration as that of the photovoltaic power generation module 100 illustrated in FIG. 4.

In other words, a pattern glass 23 of the photovoltaic power generation module 20 illustrated in FIG. 2 may include a base member 21 having an AR coating layer 21a, a protective glass 21b, and a color layer 21c, and a pattern member 22. Also, a pattern glass 33 of the photovoltaic power generation module 30 illustrated in FIG. 3 may include a base member 31 having an AR coating layer 31a, a protective glass 31b, and a color layer 31c, and a pattern member 32. The elements of each of the pattern glass 23 in FIG. 2 and the pattern glass 33 in FIG. 3 may correspond to the base member 115 having the AR coating layer 111, the protective glass 112, and the color layer 113, and the pattern member 120, respectively, included in the pattern glass 110 of the photovoltaic power generation module 100 illustrated in FIG. 4, and the corresponding elements were configured to have the same shape, material, and optical properties.

Also, a solar cell module 25 of the photovoltaic module 20 illustrated in FIG. 2 may include a glass 25a, a sealing material 25b, a solar cell 25c, a sealing material 25d, and a back sheet 25e. Also, a solar cell module 35 of the photovoltaic power generation module 30 illustrated in FIG. 3 may include a glass 35a, a sealing material 35b, a solar cell 35c, a sealing material 35d, and a back sheet 35e. The elements provided in the solar cell module 25 of FIG. 2 and the solar cell module 35 of FIG. 3 may correspond to the glass 131, the sealing material 132, the solar cell 133, the sealing material 134, and the back sheet 135 included in the solar cell module 130 of the photovoltaic power generation module 100 illustrated in FIG. 4.

However, as the photovoltaic power generation module 20 was configured to have a multilayer structure, an air gap G may be formed between the pattern glass 23 and the solar cell module 25, and in the photovoltaic power generation module 30 in FIG. 3, a filler was configured to entirely fill a space between the pattern glass 33 and the solar cell module 35 to form a single layer structure.

Meanwhile, as for a viewing angle illustrated in the graphs in FIGS. 8A and 8B, with reference (a reference surface) to a surface perpendicular to the base member 115 in FIGS. 2 to 5, a viewing angle of when light is incident in a direction inclined to the left side from the reference surface by a certain angle may be indicated as positive (+), and a viewing angle of when light is incident in a direction inclined to the right side from the reference surface by a certain angle may be indicated as negative (−).

In other words, when the pattern member 120 illustrated in FIGS. 2 to 5 is stood (mounted on an external wall of a building) for the left side to be an upper side (when the pattern member 120 is rotated in a clockwise direction by 90 degrees), a negative (−) viewing angle area of the left side may indicate transmittance and reflectance of light incident from the right side (a lower side of a building), and a positive (+) viewing angle area of the right side may indicate transmittance and reflectance of light incident from the left side (an upper side of a building), in the graphs in FIGS. 8A and 8B.

As illustrated in FIGS. 8A and 8B, in the first comparative example having a multilayer structure illustrated in FIG. 2, transmittance at a viewing angle of the upper side (positive) of a building may be higher than transmittance at a viewing angle of the lower side (negative) of the building, and on the contrary, reflectance at a viewing angle of the lower side of the building may be higher than reflectance at a viewing angle of the upper side of the building.

Thus, transmittance of light incident in an upper side direction (positive viewing angle) of the building may be high such that the amount of light transmitted to the solar cell 133 may increase, and as transmittance of light incident in a lower side direction (negative viewing angle) of the building may be relatively low and reflectance may be relatively high such that an unnecessary increase of transmittance of gaze light transmitted to an observer positioned on the lower side of the building may be prevented.

However, as the first comparative example (multilayer structure) illustrated in FIG. 2 has a multilayer structure, workability and assembling properties may significantly degrade, which may be a problem.

When a shape in which the filler 37 entirely fills a space between the pattern glass 33 and the solar cell module 35 as in the second comparative example illustrated in FIG. 3 so as to change a structure of the first comparative example (multilayer structure) illustrated in FIG. 2 to be a single layer structure is included, there may be almost no difference in refractive indexes between the pattern member 32 having a refractive index of about 1.5-1.6 and the filler 37 (e.g., EVA) having a refractive index of about 1.5-1.6. Accordingly, it may be difficult for total reflection to occur on a boundary surface between the pattern member 32 and the filler 37.

Accordingly, in the second comparative example in FIG. 3, an optical pattern of the pattern member 32 which was configured in consideration of transmittance and reflectance according to a viewing angle may not be able to perform an optical function, and accordingly, transmittance in a lower side direction (negative viewing angle) of the building may increase, but reflectance of light incident in the lower side direction of the building may rapidly decrease, which may cause an aesthetic problem to an observer.

Meanwhile, as illustrated in FIGS. 8A and 8B, it has been indicated that, when an area ratio of the supportive adhering part 160 was configured differently and was compared with that of the first comparative example (multilayer structure) illustrated in FIG. 2, the more the area ratio of the supportive adhering part 160 increased, the more the transmittance increased and reflectance decreased.

In the present disclosure, the multilayer structure of the first comparative example illustrated in FIG. 2 may be changed to a single layer structure without a significant difference in optical performance. To this end, transmittance which is not significantly different from that of a multilayer structure in an upper side direction (positive viewing angle) of the building, and reflectance which is not greatly decreased from that of the multilayer structure in a lower side direction (negative viewing angle) of the building may be necessary.

In consideration of the example illustrated in FIGS. 8A and 8B, an overall area of the supportive adhering part 160 may be 3-20% of an area of the pattern member 120 preferably.

When the area ratio is 20% or higher, reflectance may be less than 25% in a lower side direction (negative viewing angle) of the building such that there may be an aesthetic problem to an observer, and when the area ratio is less than 3%, there may be a problem in which adhesion performance and support performance of the supportive adhering part 160 may degrade. Particularly, when the area ratio is less than 3%, there may be a problem in which the supportive adhering part 160 may be deformed such that the supportive adhering part 160 may not support a weight of the pattern glass 110.

An overall area of the supportive adhering part 160 may be 5-13% of an area of the pattern member 120 preferably. In this case, adhesion performance and support performance of the supportive adhering part 160 may be sufficiently secured, and transmittance and reflectance may be maintained to be similar to transmittance at a positive viewing angle and reflectance at a negative viewing angle of a multilayer structure.

Accordingly, the photovoltaic power generation module 100 in the embodiment of the present disclosure may improve workability and assembling properties by configuring the multilayer structure as in the first comparative example illustrated in FIG. 2 to be a single layer structure, and an effect in which there may be no significant difference in terms of optical properties as compared to the multilayer structure as in the first comparative example illustrated in FIG. 2 may be obtained.

In the description below, a photovoltaic power generation module 100 according to another example embodiment will be described with reference to FIGS. 9 and 11.

Figure 9:
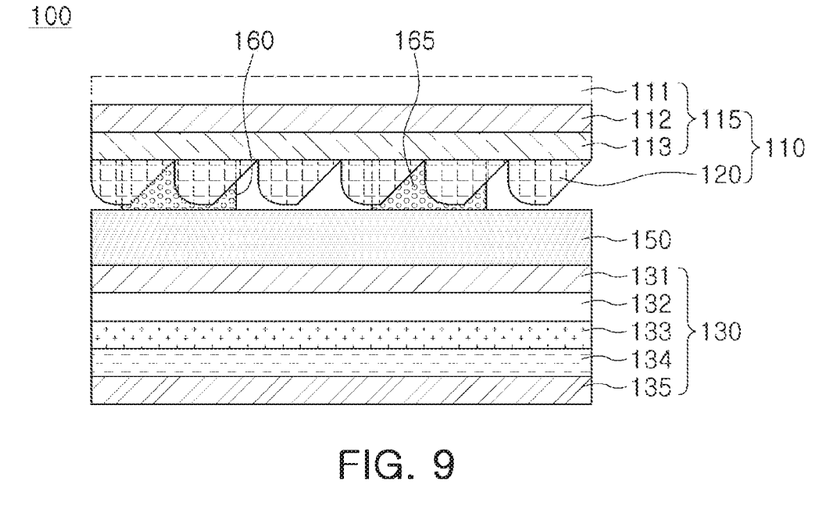
FIG. 9 is a schematic view illustrating a photovoltaic power generation module having a single layer structure of a modified example of the present disclosure.

The photovoltaic power generation module 100 illustrated in FIG. 9 may have the same configuration as in the embodiment illustrated in FIGS. 4 and 5 other than the configuration in which the supportive adhering part 160 may further include a light scattering agent 165. Thus, the detailed descriptions of the same or similar elements will not be provided to avoid unnecessary overlapping description.

When the supportive adhering part 160 is adhered to the pattern member 120 according to an embodiment of the present disclosure, there may be almost no difference in refractive indexes on an adhesive boundary surface such that total reflection may rarely occur, and accordingly, reflectance may decrease at a negative viewing angle, which may be a problem.

However, as illustrated in FIG. 9, when the supportive adhering part 160 includes the light scattering agent 165, the light scattering agent 165 may scatter incident light such that transmittance may decrease, and reflectance may increase. As the light scattering agent 165, polymer particle or a polymer material such as a haze ball may be used, but a type of the light scattering agent 165 is not limited thereto.

By adjusting the amount of the light scattering agent 165, transmittance and reflectance may be adjusted.

Figure 10A:
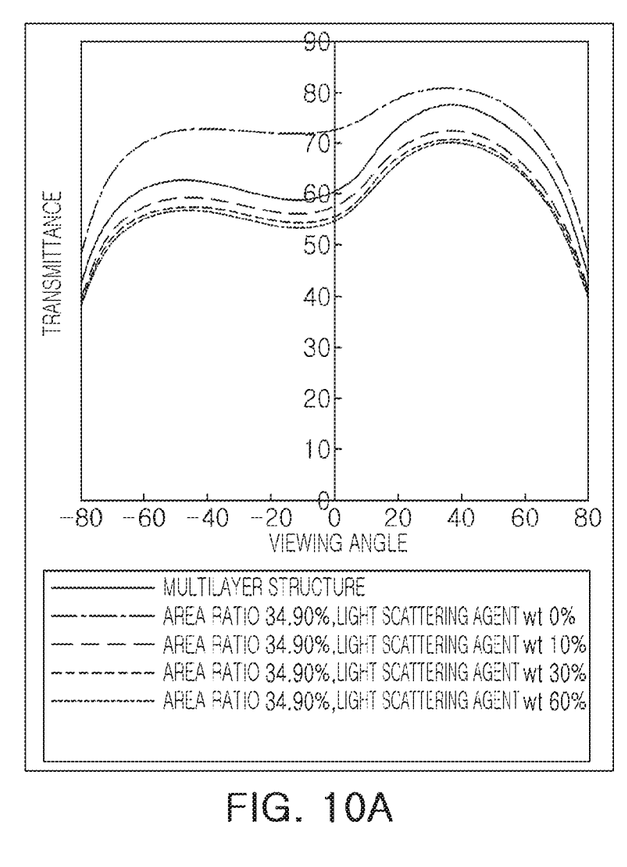
Figure 10B:
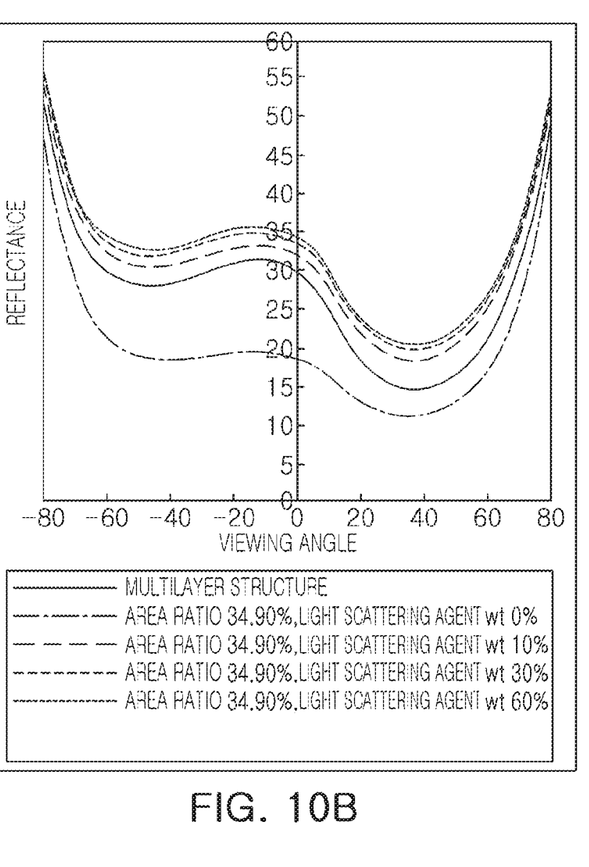

FIGS. 10A and 10B illustrate changes in transmittance and reflectance according to changes in weight ratio (wt %) of a light scattering agent to a total weight of the supportive adhering part 160 including the light scattering agent 165. As the light scattering agent 165, a TiO2 haze ball having a refractive index of 2.1 was used, and only a weight ratio was configured differently.

As illustrated in FIGS. 10A and 10B, when the light scattering agent 165 is not used, transmittance increased at a positive viewing angle, but reflectance greatly decreased at a negative viewing angle such that an aesthetic problem may be caused to an observer.

However, it has been indicated that, by increasing a weight ratio of the light scattering agent 165, reflectance at a negative viewing angle increased.

In consideration of the above example, the light scattering agent 165 may be included in the supportive adhering part by 5-60 weight % preferably.

When a weight ratio of the light scattering agent is less than 5 wt %, an effect of scattering may not be significant such that an effect of compensation for a refractive index may not be significant. When the weight ratio exceeds 60 wt %, reflectance at a negative viewing angle may be sufficiently secured, but an adhesive ratio of the supportive adhering part 160 may decrease such that it may be difficult for the supportive adhering part 160 to perform a function as a support and an adhesive.

The supportive adhering part 160 may include a color pigment (dye) instead of the light scattering agent 165. By using such a color pigment, a scattering effect and an effect of increase of reflectance may be obtained.

Figure 11A:
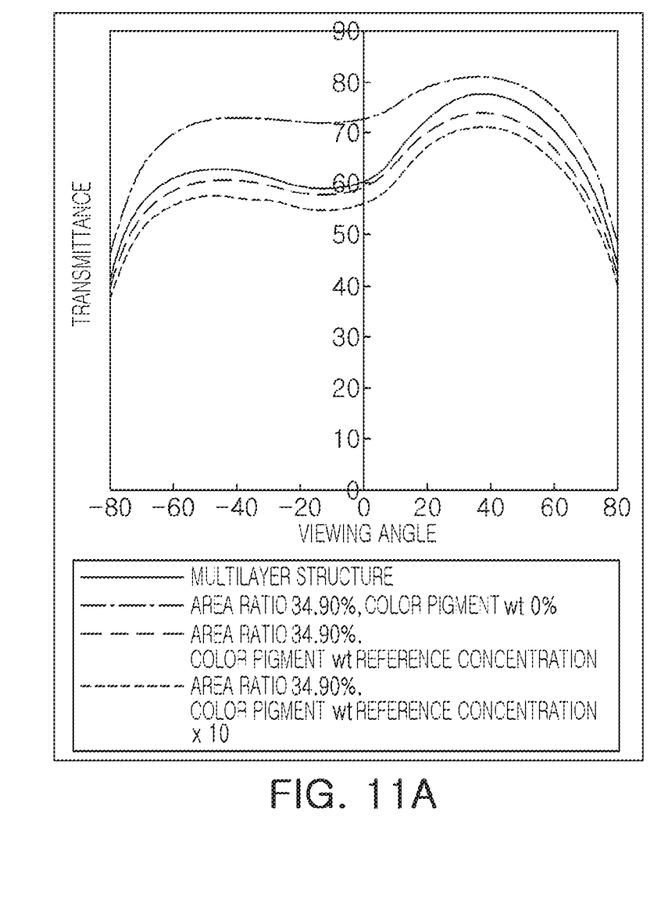
Figure 11B:
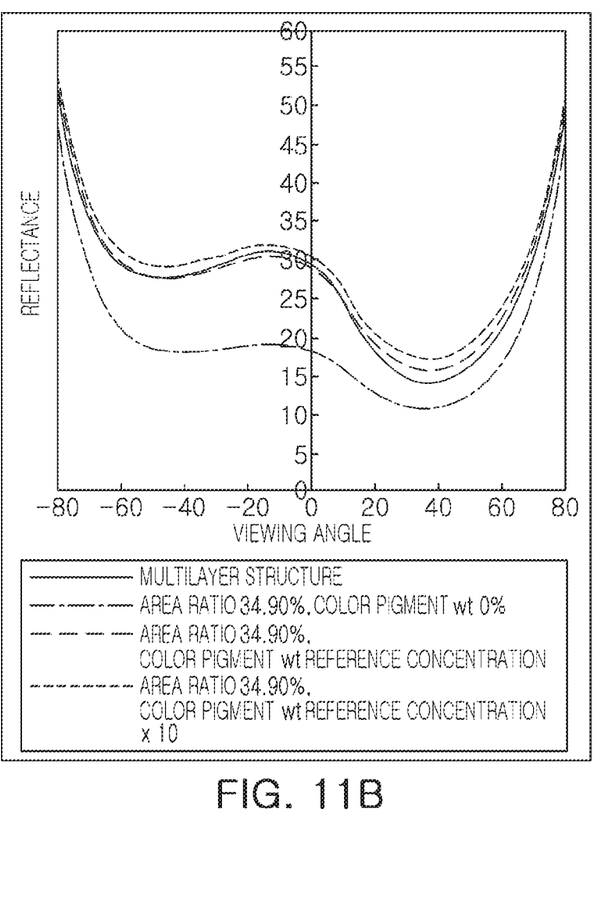

As illustrated in FIGS. 11A and 11B, when a color pigment is not added, reflectance at a negative viewing angle may greatly decrease, but when a color pigment is added, reflectance at a negative viewing angle may be almost similar to that of the multilayer structure as in the first comparative example illustrated in FIG. 2.

In this case, the color pigment may be included in the supportive adhering part 160 by 3-30 weight % preferably. In FIGS. 11A and 11B, a reference concentration refers to a case in which the supportive adhering part 160 includes 3 weight % of the color pigment.

When the color pigment is less than 3 wt %, the scattering and an effect of increase of reflectance at a negative viewing angle according to the scattering may not be significant. When the color pigment exceeds 30 wt %, an increase of reflectance may not be greatly resolved and there may be a limitation in support and adhesion performance of the supportive adhering part 160, and costs may increase, which may be a problem.

Although the embodiments of the present disclosure have been described in detail above, the scope of rights of the present invention is not limited thereto, and it will be obvious to those skilled in the art that various modifications and variations may be made without departing from the technical spirit of the present disclosure as set forth in the claims.

DESCRIPTION OF REFERENCE NUMERALS

100 . . . photovoltaic power generation module
110 . . . pattern glass
111 . . . AR coating layer
112 . . . protective glass
113 . . . color layer
115 . . . base member
120 . . . pattern member
130 . . . solar cell module
131 . . . glass
132 . . . sealing material
133 . . . solar cell
134 . . . sealing material
135 . . . back sheet
150 . . . filler
160 . . . supportive adhering part
165 . . . light scattering agent

The invention claimed is:

1. A photovoltaic power generation module, comprising:
a pattern glass including a base member, and a pattern member provided on the base member and including an optical pattern formed thereon;
a solar cell module including a solar cell;
a plurality of supportive adhering parts adhered to the pattern member and each having a cylindrical shape; and
a filler filling a space between the supportive adhering parts and the solar cell module,
wherein the pattern glass and the solar cell module are integrated with each other through the supportive adhering parts and the filler,
wherein a height of the supportive adhering parts is formed to be higher than a height of the pattern member such that a gap for forming an air layer between the pattern member and the filler is provided, and
wherein an overall area of the supportive adhering parts is 5% to 13% of an area of the pattern member.

2. The photovoltaic power generation module of claim 1, wherein the optical pattern includes an asymmetrical prism.

3. The photovoltaic power generation module of claim 1, wherein the optical pattern has a shape in which transmittance is higher and reflectance is lower at a viewing angle on one side than at a viewing angle on the other side with reference to a surface perpendicular to the base member.

4. The photovoltaic power generation module of claim 1, wherein the gap is within a range of 10-1000 μm.

5. The photovoltaic power generation module of claim 1, wherein the filler includes an acetate-based or silicone-based material.

6. The photovoltaic power generation module of claim 1, wherein the supportive adhering parts include an optically clear adhesive (OCA).

7. The photovoltaic power generation module of claim 1, wherein the supportive adhering parts include a light scattering agent.

8. The photovoltaic power generation module of claim 7, wherein the light scattering agent is included in the supportive adhering parts by 5-60 weight %.

9. The photovoltaic power generation module of claim 1, wherein the supportive adhering parts include a color pigment.

10. The photovoltaic power generation module of claim 9, wherein the color pigment is included in the supportive adhering parts by 3-30 weight %.

11. The photovoltaic power generation module of claim 1, wherein the photovoltaic power generation module includes a glass for protecting the solar cell, and
wherein the filler fills a space between the glass and the supportive adhering parts.

* * * * *